United States Patent
Kim et al.

(10) Patent No.: US 6,853,317 B2
(45) Date of Patent: Feb. 8, 2005

(54) CIRCUIT AND METHOD FOR GENERATING MODE REGISTER SET CODE

(75) Inventors: Chul Soo Kim, Suwon (KR); Kyu-Hyoun Kim, Suwon (KR)

(73) Assignee: Samsung Electronics Co., LTD, Suwon (KR)

(*) Notice: Subject to any disclaimer, the term of this patent is extended or adjusted under 35 U.S.C. 154(b) by 0 days.

(21) Appl. No.: 10/405,484

(22) Filed: Apr. 3, 2003

(65) Prior Publication Data

US 2004/0075591 A1 Apr. 22, 2004

(30) Foreign Application Priority Data

Oct. 21, 2002 (KR) .................. 10-2002-0064251

(51) Int. Cl.⁷ ............................................. H03M 7/00
(52) U.S. Cl. .......................... 341/50; 341/51; 341/65
(58) Field of Search ..................... 341/65, 50, 51; 365/233

(56) References Cited

U.S. PATENT DOCUMENTS 4,876,642 A * 10/1989 Gibson ...................... 712/233
5,566,108 A * 10/1996 Kitamura .................... 365/233
6,215,723 B1 * 4/2001 Kang et al. ............. 365/230.06

* cited by examiner

*Primary Examiner*—Jean Bruner Jeanglaude
(74) *Attorney, Agent, or Firm*—Harness, Dickey & Pierce P.L.C.

(57) ABSTRACT

A circuit that includes a data input circuit for outputting data in response to a first signal, a logic circuit for generating a second signal in response to the first signal, a latch circuit for latching the data in response to the second signal, and a decoder for decoding an output signal of the latch circuit and for generating a code. A method includes outputting a mode register set (MRS) code based upon data received by a circuit implemented in a semiconductor device, where the data is unrelated to register data.

20 Claims, 5 Drawing Sheets

CIRCUIT AND METHOD FOR GENERATING MODE REGISTER SET CODE

This application claims priority of Korean Patent Application No. 02-64251, filed Oct. 10, 2002, in the Korean Intellectual Property Office, the entire contents of which are hereby incorporated herein by reference.

BACKGROUND OF THE INVENTION

1. Field of the Invention

The present invention generally relates to a semiconductor memory device, and more particularly, to a circuit and a method for generating a mode register set (MRS) code in a synchronous semiconductor memory device.

2. Description of the Related Art

A mode register and a mode register set (MRS) may be used in a synchronous semiconductor memory device. The mode register may program and store data for controlling various operational modes of a synchronous semiconductor memory device.

In a conventional memory device, operational modes and/or characteristics of a semiconductor memory device may be dictated by input signals. However, in a synchronous semiconductor memory device, an operational mode, i.e., a column address strobe (CAS) latency mode or a burst length mode, is normally determined beforehand, and thereafter the semiconductor memory device may be accessed. The operation mode is typically set and stored in the mode register as units of bits, and a group of such mode registers may be referred to as the MRS. Therefore, a series of codes indicating a mode of the semiconductor memory device may be set in the mode register set. These codes are often referred to as the MRS codes.

Conventionally, the MRS codes may be generated by combining addresses. The operation mode of the semiconductor memory device may be determined according to the generated MRS codes. The MRS codes are typically standard Joint Electron Device Engineering Council (JEDEC) codes.

An MRS code used to test a semiconductor memory device during design of the semiconductor memory device may be referred to as a test MRS code. The test MRS codes may be generated by combining addresses. However, test MRS codes are not standardized MRS codes; therefore, they are normally generated by combining certain addresses, while excluding other addresses. Accordingly, a limited number of test MRS codes may be generated.

SUMMARY OF THE INVENTION

An exemplary embodiment of the present invention may provides an MRS code generating circuit capable of generating various test MRS codes. The test MRS codes may be generated without excluding certain address.

An exemplary embodiment of the present invention may provides a method of generating various test MRS codes. The test MRS codes may be generated without excluding certain address.

Moreover, an exemplary embodiment of the present invention provides a circuit that includes a data input circuit for outputting data in response to a first signal, a logic circuit for generating a second signal in response to the first signal, a latch circuit for latching the data in response to the second signal, and a decoder for decoding an output signal of the latch circuit and for generating a code.

Yet another exemplary embodiment of the present invention provides a method for generating a code that includes outputting data in response to a first signal, generating a second signal in response to the first synchronizing signal, latching the data in response to the second signal, and decoding the latched data and generating the code.

Moreover, another exemplary embodiment of the present invention provides a circuit that includes a device for outputting a mode register set (MRS) code based on data received by the circuit, where the data is unrelated to register data.

Another exemplary embodiment of the present invention provides a method that includes outputting a mode register set (MRS) code based upon data received by a circuit implemented in a semiconductor device, where the data is unrelated to register data.

BRIEF DESCRIPTION OF THE DRAWINGS

Exemplary embodiments of the present invention will become more fully understood from the detailed description given hereinbelow and the accompanying drawings which are given by way of illustration only, and thus are not limitative of the present invention, and wherein.

DETAILED DESCRIPTION OF EXEMPLARY EMBODIMENTS

Figure 1:
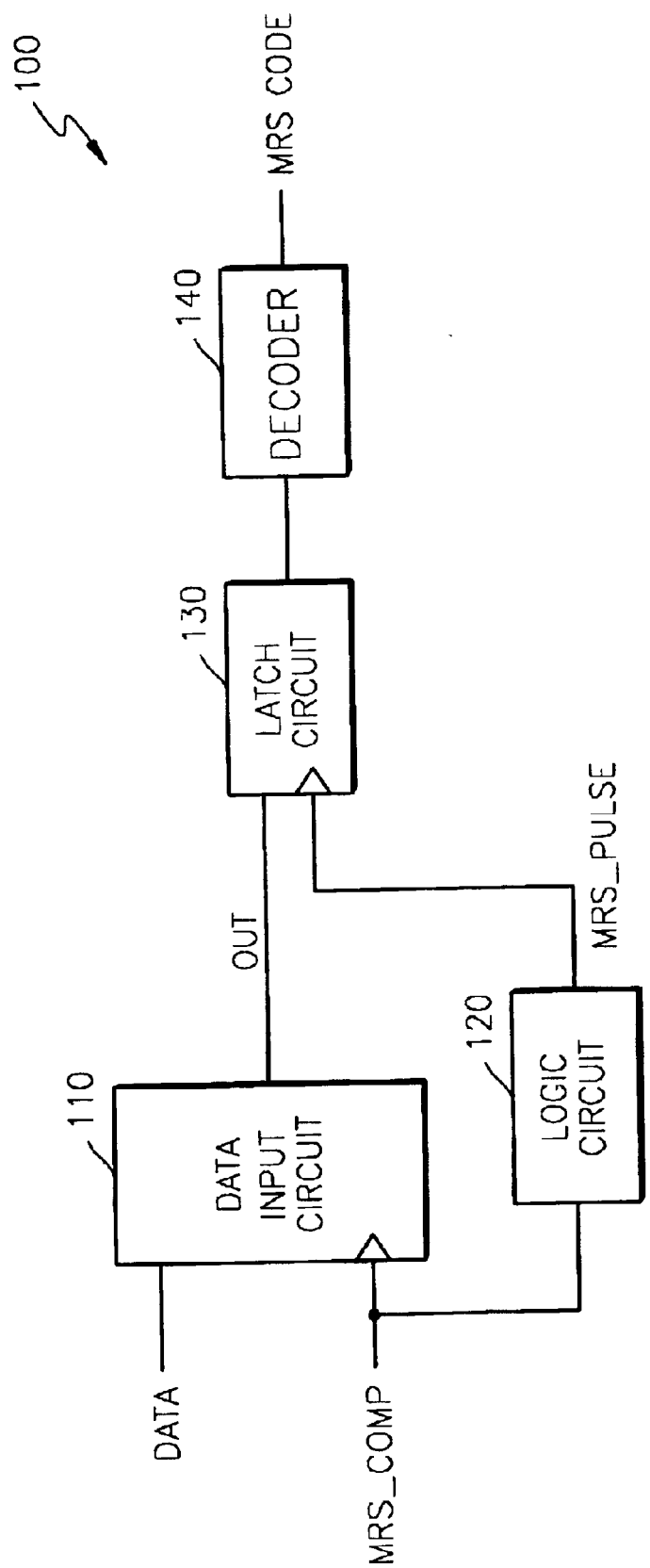
FIG. 1 illustrates an MRS code generating circuit of a semiconductor memory device according to an exemplary embodiment of the present invention.

Exemplary embodiments of the present invention now will be described more fully with reference to the accompanying drawings. In the drawings, like reference numerals are used to refer to like elements throughout.

FIG. 1 illustrates an MRS code generating circuit of a semiconductor memory device according to an exemplary embodiment of the present invention. An MRS code generating circuit 100 of FIG. 1 may include a data input circuit 110, a logic circuit 120, a latch circuit 130 and a decoder 140.

The data input circuit 110 may receive data DATA and may output the input data DATA in response to a first synchronizing signal MRS_COMP. The logic circuit 120 may generate a second synchronizing signal MRS_PULSE capable of latching an output signal of the data input circuit 110 in response to the first synchronizing signal MRS_COMP.

The latch circuit 130 may receive an output signal of the data input circuit 110 and is capable of latching the output signal of the data input circuit 110 in response to the second synchronizing signal MRS_PULSE. The decoder 140 may receive an output signal of the latch circuit 130. The decoder 140 is capable of decoding the output signal of the latch circuit 130 and generating an MRS code of the semiconductor memory device.

Figure 2:
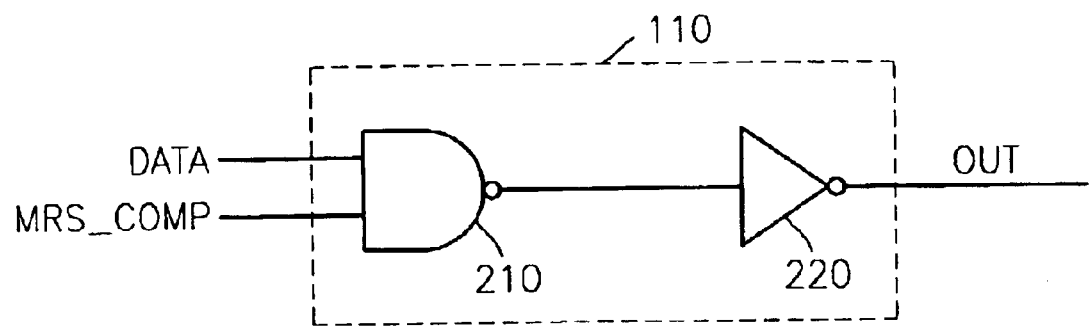
FIG. 2 illustrates a data input circuit of FIG. 1.

FIG. 2 illustrates the data input circuit 110 of FIG. 1. The data input circuit 110 shown in FIG. 2 may include a NAND gate 210 and an inversion circuit 220. The NAND gate 210 may receive the data DATA and the first synchronizing signal MRS_COMP. The NAND gate 210 may perform a NAND operation on the input signals and output a resultant NAND signal. The inversion circuit 220 may receive the output signal of the NAND gate 210, invert the output signal of the NAND gate 210, and is capable of inverting the output signal as an output signal OUT.

Figure 3:
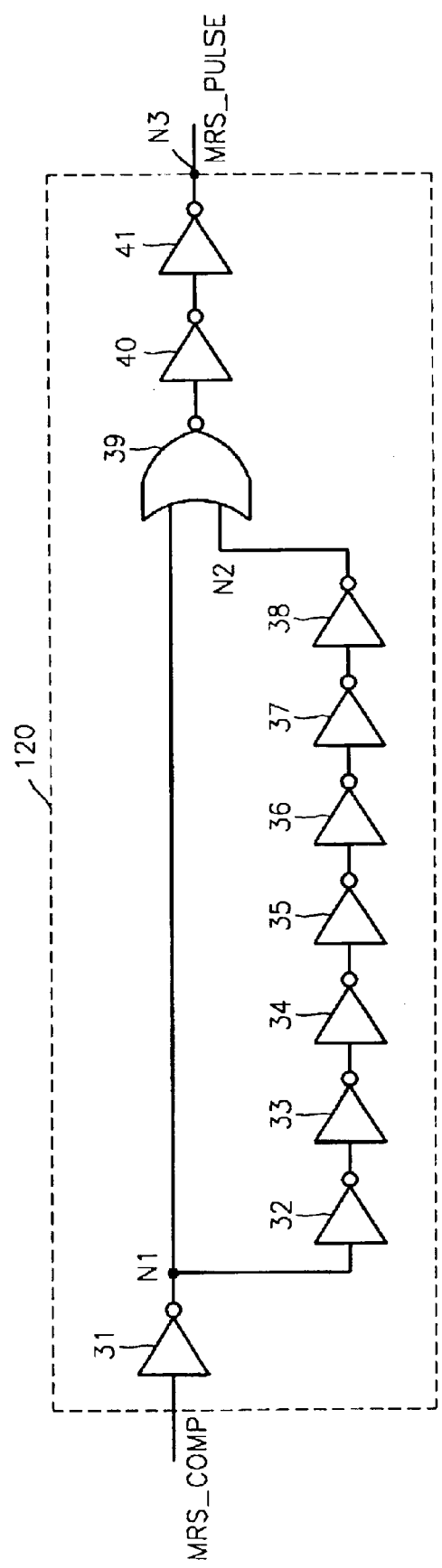
FIG. 3 illustrates a logic circuit of FIG. 1.

FIG. 3 illustrates the logic circuit 120 of FIG. 1. The logic circuit 120 shown in FIG. 3 may include a plurality of inversion circuits 31, 32, 33, 34, 35, 36, 37, 38, 40, 41 and a NOR gate 39.

The inversion circuit 31 may receive the first synchronous signal MRS_COMP, invert the first synchronous signal MRS_COMP and is capable of outputting an inverted first synchronous signal MRS_COMP as an output signal MRS_PULSE. The inversion circuits 32, 33, 34, 35, 36, 37, 38 may be connected in series, and the output node N2 of the inversion circuit 38 may be connected to an input node of the NOR gate 39. The NOR gate 39 is capable of receiving an output signal of the inversion circuit 31 and an output signal of the inversion circuit 38. In such a case, the NOR gate 39 is capable of performing a NOR operation on the signals received thereby. The inversion circuit 40 may receive the output signal of the NOR gate 39, and is capable of outputting an inverted signal thereof. The inversion circuit 41 may receive the output signal of the inversion circuit 40, and is capable of outputting an inverted signal thereof. As was indicated, the logic circuit 120 is capable of outputting the output signal MRS_PULSE.

Figure 4:
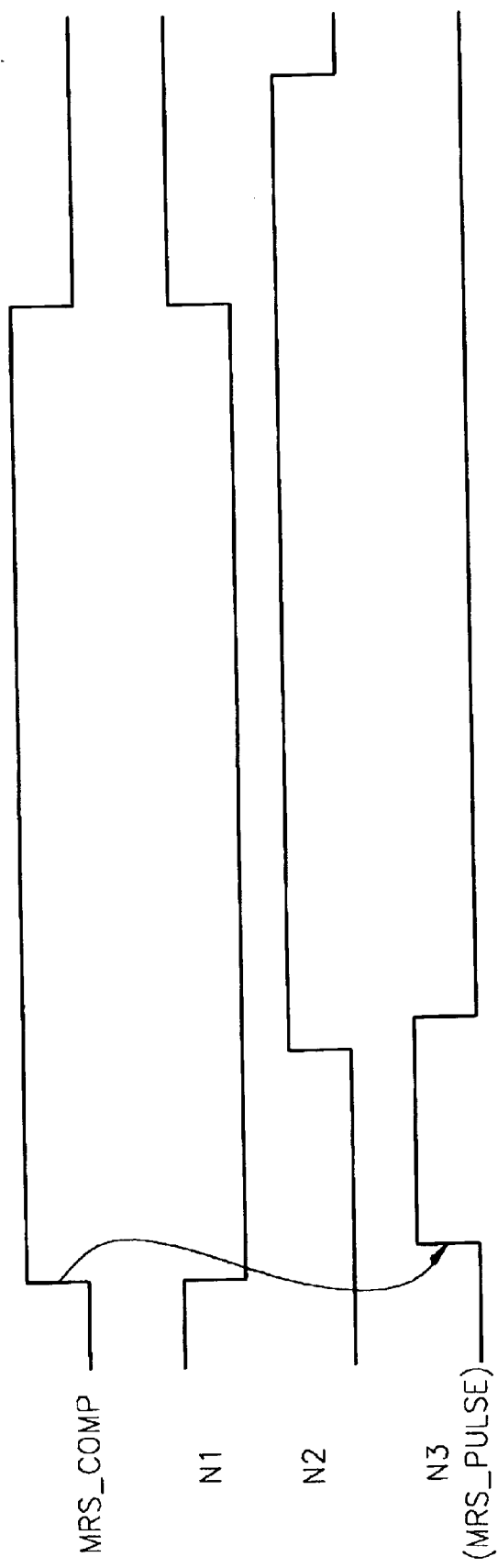
FIG. 4 illustrates a timing diagram showing waveforms at each node in the logic circuit of FIG. 3.

FIG. 4 illustrates a timing diagram showing waveforms at each node in the logic circuit 120 of FIG. 3. As is illustrated, in one exemplary embodiment of the present invention, if a waveform of the first synchronizing signal MRS_COMP is at a logic low level, a signal at a node N1 is at a logic high level. Conversely, if a waveform of the first synchronizing signal MRS_COMP is at a logic high level, a signal at the node N1 is at a logic low level. The signals observed at the node N1 are output from the inversion circuit 31. In addition, as is illustrated in FIG. 4, a waveform at a node N2 may be generated by inverting a waveform at the node N1. As is illustrated, a signal at the node N2 is delayed by an amount of time. This delay is caused by the inversion circuits 32, 33, 34, 35, 36, 37, 38.

The number of inversion circuits in FIG. 4 is shown by way of example only. If a greater delay is desired, then a number of inversion circuits may be increased. Alternatively, if less delay is desired, the number of inversion circuits may be decreased.

In order to generate the second synchronizing signal MRS_PULSE, it may be beneficial if a number of the inversion circuits between the nodes N1 and N2 is an odd number.

An inverted signal of the first synchronizing signal MRS_COMP may be output to the first node N1. The signal at the first node N1 may be inverted and delayed by way of the various inversion circuits 32–38. An output of the various inversion circuits 32–38 is received at the second node N2. The third node N3 receives the output of the inversion circuit 41, which is illustrated in FIG. 4 as the second synchronizing signal MRS_PULSE.

Figure 5:
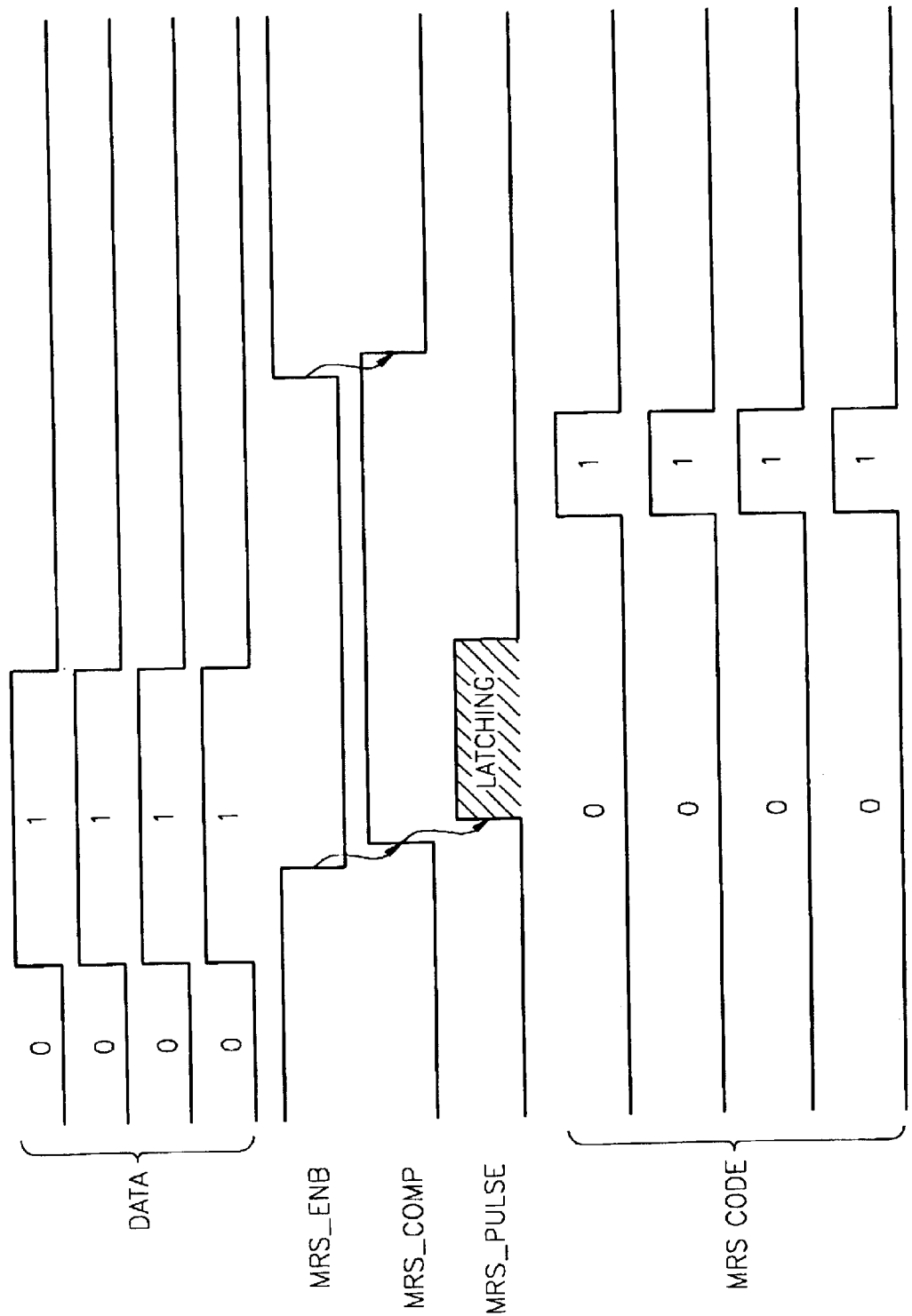
FIG. 5 illustrates a timing diagram providing an operational example of the MRS code generating circuit of FIG. 1.

FIG. 5 illustrates a timing diagram providing an operational example of the MRS code generating circuit of FIG. 1. Hereinafter, the operation of the MRS code generating circuit 100 according to an exemplary embodiment of the present invention will be described with reference to FIGS. 1 through 5.

Data DATA may be input to the data input circuit 110 in response to a data read command, for example, of a semiconductor memory device. In one exemplary embodiment of the present invention, data of 1111 are input to the data input circuit 110. Partly in response to the input data, an MRS enable signal MRS_ENB capable of activating an MRS mode is produced. The MRS enable signal may cause the generation of the first synchronizing signal MRS_COMP. The MRS mode may represent a mode for generating an MRS code in the semiconductor memory device. The MRS mode may be enabled by the MRS enable signal MRS_ENB.

The data input circuit 110 may receive the data DATA and output the data DATA in response to the first synchronizing signal MRS_COMP, which is activateable in response to the MRS enable signal MRS_ENB. An output signal of the data input circuit 110 may be received by the latch circuit 120.

In response to the first synchronizing signal MRS_COMP, the logic circuit 120 may generate the second synchronizing signal MRS_PULSE for latching the output signal of the data input circuit 110. The latch circuit 130 may receive the output signal OUT of the data input circuit 110 and latch the output signal of the data input circuit 110 in response to the second synchronizing signal MRS_PULSE. The output signal OUT of the data input circuit 110 may be latched when the second synchronizing signal MRS_PULSE is at a logic level high. An example of when the second synchronizing signal MRS_PULSE is at a logic high is illustrated in FIG. 5.

The decoder 140 may decode the data latched by the latch circuit 130 and output decoded data. The output signal of the decoder 140 may be the MRS code of the semiconductor memory device. In an exemplary embodiment of the present invention, different MRS codes may be generated in response to the input data DATA; moreover, the input data DATA may be used as the MRS code generated in the decoder 140.

In accordance with an exemplary embodiment of the present invention, it is possible to generate a variety of MRS codes, by setting and storing the operation modes of one or more semiconductor memory devices. This may be achieved by generating MRS codes by using inputted data, as described above. For example, if 16 of data streams are inputted in the semiconductor memory device, $2^{16}$, i.e., 65535 of MRS codes may be generated. In addition, according to an exemplary embodiment of the present invention, a designer of a semiconductor memory device can initiate tests thereon.

Hereinafter, a method of generating MRS codes according to an exemplary embodiment of the present invention will be described with reference to FIGS. 1 through 5. The data input circuit 110 of FIG. 1 may receive the data DATA and output the data DATA in response to the first synchronizing signal MRS_COMP.

The logic circuit 120 may generate the second synchronizing signal MRS_PULSE for latching the output data in response to the first synchronizing signal MRS_COMP. The latch circuit 130 may latch the output data in response to the second synchronizing signal MRS_PULSE, and the decoder 140 may decode the latched data and generate the MRS code.

The circuit elements illustrated in FIGS. 2 and 3 are given by way of example only. In particular, those of skill in the art appreciate various other implementations of the data input and logic circuits 110 and 120, respectively, are also possible. Moreover, those of skill in the art understand the present invention is not limited to hardware implementation.

In particular, the exemplary embodiments of the present invention may also be realized in software and implemented as such, or programmed on a hardware device.

A method of generating the MRS code according to an exemplary embodiment of the present invention may include generating the MRS code by using input data in contrast to a conventional method of generating the MRS code. Therefore, various MRS codes may be generated.

As described herein, a circuit and a method according to an exemplary embodiment of the present invention provide for the generation of an MRS code using input data. This reduces the need to combine addresses to produce an MRS code. Therefore, according to an exemplary embodiment of the present invention, a wide variety of MRS codes may be generated.

In addition, during a design process of a semiconductor memory device, a test MRS code may be generated from various MRS codes. Therefore, a semiconductor memory device may be effectively designed by using such a test MRS code.

While the present invention has been described with reference to exemplary embodiments thereof, it will be understood by those skilled in the art that various changes in form and details may be made without departing from the spirit and scope of the present invention as defined by the claims.

What is claimed is:

1. A circuit, comprising:
    a data input circuit for outputting data in response to a first signal;
    a logic circuit for generating a second signal in response to the first signal;
    a latch circuit for latching the data in response to the second signal; and
    a decoder for decoding an output signal of the latch circuit and for generating a code.

2. The circuit according to claim 1, wherein the data input circuit receives input data and performs a NAND operation on the received input data and the first signal, a resultant of the NAND operation is at least a portion of the data.

3. The circuit according to claim 1, wherein the logic circuit comprises:
    a first inversion circuit for inverting the first signal and outputting an inverted signal;
    a delay circuit for receiving and inverting the inverted signal output to produce another inverted signal; and
    a NOR circuit for receiving the inverted signal from the first inversion circuit and the another inverted signal from the delay circuit and for outputting the second signal by performing a NOR operation of the inverted signals.

4. The circuit according to claim 3, wherein the delay circuit includes a plurality of inversion circuits which are connected in series, and the number of inversion circuits is an odd number.

5. The circuit according to claim 1, wherein the decoder generates a mode register set code and generates different mode register set codes for each unique data value input thereto.

6. The circuit according to claim 1, wherein the data input circuit receives the data output therefrom.

7. The circuit according to claim 1, wherein the latch circuit receives the data from the data input circuit.

8. The circuit according to claim 1, wherein the first signal is in part generated by an enable signal generated by a device the circuit is coupled to.

9. The circuit according to claim 8, wherein the device is a semiconductor device.

10. The circuit according to claim 1, wherein the first and second signals are synchronizing signals.

11. The circuit according to claim 1, wherein the code is a mode register set code.

12. A method for generating a code, the method comprising:
    outputting data in response to a first signal;
    generating a second signal in response to the first synchronizing signal;
    latching the data in response to the second signal; and
    decoding the latched data and generating the code.

13. The method according to claim 12, wherein outputting data includes receiving input data, and performing a NAND operation on the input data and the first signal.

14. The method according to claim 12, wherein generating the second signal comprises:
    receiving and inverting the first signal and outputting an inverted signal;
    receiving and inverting the inverted signal and outputting another inverted signal; and
    receiving the inverted signals and performing a NOR operation on thereon.

15. The method according to claim 12, wherein decoding and generating the code includes generating different codes for each unique output data value.

16. A semiconductor device including the circuit of claim 1.

17. A circuit, comprising:
    a device for outputting a mode register set (MRS) code based on data received by the circuit, the data being unrelated to register data.

18. The circuit according to claim 17, further comprising:
    an input circuit for outputting data in response to a control signal;
    a logic circuit for generating another control signal in response to the control signal; and
    a latching circuit for latching the data in response to the another control signal.

19. The circuit according to claim 18, wherein the latched data is received by the device and decoded thereby.

20. A method, comprising:
    outputting a mode register set (MRS) code based upon data received by a circuit implemented in a semiconductor device, the data being unrelated to register data.

* * * * *